United States Patent [19]

Tada et al.

[11] Patent Number: 4,465,969

[45] Date of Patent: Aug. 14, 1984

[54] VOLTAGE AND ELECTRIC FIELD MEASURING DEVICE USING LIGHT

[75] Inventors: Koji Tada; Hirokuni Nanba; Yoshiki Kuhara; Masayoshi Tatsumi, all of Osaka, Japan

[73] Assignee: Sumitomo Electric Industries, Ltd., Isajam, Japan

[21] Appl. No.: 197,432

[22] Filed: Oct. 16, 1980

[30] Foreign Application Priority Data

Jan. 12, 1980 [JP] Japan .................................. 55-2274
Jul. 14, 1980 [JP] Japan .................................. 55-96617

[51] Int. Cl.$^3$ ........................ G01R 19/00; G01R 5/28; G02F 1/26
[52] U.S. Cl. .................................. 324/96; 324/109; 324/458; 350/390
[58] Field of Search ................. 324/96, 109, 457, 458; 350/390; 332/7.51; 455/616

[56] References Cited

U.S. PATENT DOCUMENTS 3,466,541 9/1969 Bernard et al. ........................ 324/96
3,531,179 9/1970 Jaffe et al. ............................ 350/390

OTHER PUBLICATIONS

Cotton, et al.; Advanced Inorganic Chemistry; Interscience Pubs., N.Y., NY 1967; pp. 46 and 605.
Cassidy et al.; "Development . . . "; IEEE Trans. on Instrumentation and Measurement;. vol. IM-19; No. 4; Nov. 1970; pp. 395-402.

Primary Examiner—Ernest F. Karlsen
Attorney, Agent, or Firm—Sughrue, Mion, Zinn, Macpeak, and Seas

[57] ABSTRACT

A voltage and electric field measuring device using light as an operating parameter. An electro-optic crystal, a quarter-wave plate, and a polarization analyzer are arranged in that order in the direction of advancement of applied light. A voltage may be applied to the electro-optic crystal through electrodes arranged thereon. The electro-optic crystal belongs to a cubic system, such as bismuth silicon oxide or bismuth germanium oxide.

5 Claims, 15 Drawing Figures

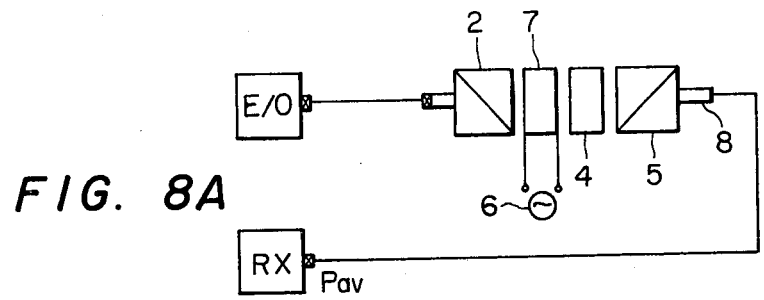
FIG. 8A
FIG. 8B
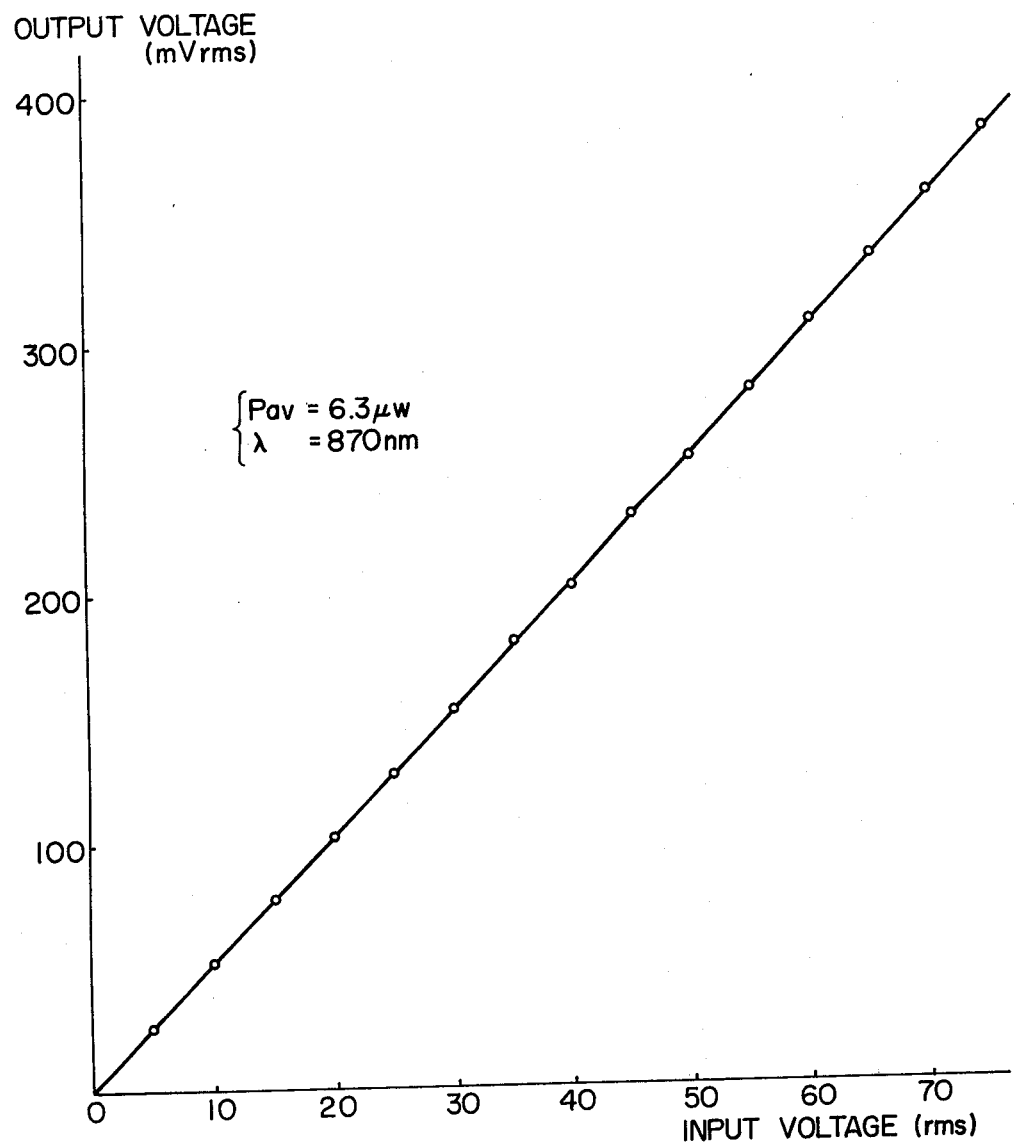

VOLTAGE AND ELECTRIC FIELD MEASURING DEVICE USING LIGHT

BACKGROUND OF THE INVENTION

The present invention relates to voltage and electric field measuring devices utilizing optical polarization. More particularly, the invention relates to a voltage and electric field measuring device of which the temperature characteristic is improved.

Fundamentally, a measuring device of the general type to which the invention pertains operates by measuring a voltage applied to an electro-optic crystal. Such a measuring device can be used as a voltage measuring device if electrodes connected to both surfaces of the electro-optic crystal are connected directly to terminals across which a voltage to be measured is applied and may be used as an electric field measuring device if it is placed in an electric field to be measured with the electrodes removed.

An example of a voltage measuring device utilizing light is shown in FIG. 1A. A polarizer 2, an electro-optic crystal 3, a quarter-wave plate 4 and an analyzer 5 are arranged in the stated order in the direction of advancement of light from a light source 1. A voltage to be measured generated by a voltage source 6 is applied to the electro-optic crystal 3.

The polarizer 2 converts the light from the light source 1 into linearly polarized light and the electro-optic crystal 3 subjects the linearly polarized light to a phase change resulting in elliptically polarized light. When the voltage to be measured, hereinafter referred to as the "measurement voltage" when applicable, is at zero, the electro-optic crystal has refractive indices $n_x$ and $n_y$ and when the measurement voltage is at V volts, the refractive indices are changed to $n_x - kV$ and $n_x - kV$ where the refractive indices $n_x$ and $n_y$ are those respectively for linear polarization in the x direction and for linear polarization in the y direction and k is a constant. If linear polarization in a direction $x_1$ is split into vector components in the x and y direction, the refractive indices in the x and y directions are different so that the speed of the light is different for the two directions. Because of this, the linearly polarized light is converted into elliptically polarized light due to the phase difference between the x and y direction components. The analyzer 5, which is disposed in a cross Nicol position with respect to the polarizer 2, changes the amplitude of the elliptically polarized light.

With the power of light incident on the polarizer 2 is represented by $P_{in}$ and the amount of loss at the measurement section is represented by l, the relation between the light output power $P_{out}$ and a voltage $V_{in}$ to be measured can be expressed by the following equation (1) when the quarter-wave plate 4 is absent:

$$P_{out} = l \cdot P_{in} \sin^2\left(\frac{\pi}{2} \cdot \frac{V_{in}}{V_\pi}\right), \quad (1)$$

where $V_\pi$ is the half-wave voltage which depends on the type of crystal used and its orientation in use.

It is desirable to operate upon a nearly linear portion of the characteristic curve of the equation (1). For this purpose, it is necessary to shift the operation to the point $\lambda/4$ as shown in FIG. 1B. To accomplish this, the quarter-wave plate 4 is provided which serves as optical biasing means. When the quarter-wave plate 4 is inserted, the following equation can be obtained from modifying the equation (1):

$$P_{out} = l \cdot P_{in} \sin^2\left(\frac{\pi}{2} \cdot \frac{V_{in}}{V_\pi} + \frac{\pi}{4}\right) =$$

$$\frac{1}{2} l \cdot P_{in} \left[ 1 + \sin\left(\pi \frac{V_{in}}{V_\pi}\right) \right].$$

In the range of $$\pi \frac{V_{in}}{V_\pi} \ll 1,$$

the equation (1) can be rewritten as the following equation (2):

$$P_{out} \approx \frac{1}{2} l \cdot P_{in} \left[ 1 + \pi \frac{V_{in}}{V_\pi} \right]. \quad (2)$$

The significance of equation (2) is illustrated in FIG. 2. The output optical signal from the analyzer is converted into an electrical signal by an element such as a PIN photodiode.

The voltage measurement is carried out according to the above-described principles. For voltage measurement, crystals of KDP, ADP, LiNbO$_3$ and LiTaO$_3$ can be used for the electro-optic crystal 3. However, the use of these crystals is disadvantageous in that the measuring device then has an unsatisfactory temperature characteristic because the refractive indices $n_x$ and $n_y$ are somewhat different and they generally have different temperature characteristics. In other words, such crystals have a natural birefringence with, for instance $n_x = n_e - kV$ and $n_y = n_o + kV$ each of which has a different temperature characteristic. This can be understood from the graphs of FIGS. 3A–3C which show examples of the temperature dependence of ordinary rays and extraordinary rays.

In order to compensate for this temperature instability, a so-called "temperature compensation type" has been proposed in which two crystals A and B are coupled together with their axes oriented in different directions. With this type, the light passing through the analyzer 5 can be described by the following equation (3):

$$A^2 \sin^2\left[\frac{\pi}{2} \cdot \frac{n_i^3 \gamma_c}{\lambda_o} V\left(\frac{l_1}{d_1} + \frac{l_2}{d_2}\right) + \right. \quad (3)$$

$$\left. \frac{\pi}{\lambda}(n_o - n_e)(l_1 - l_2) + \psi_o' - \psi_e' \right]$$

where $\psi_o'$ is the polarization angle for ordinary light, $\psi_e'$ is the polarization angle for extraordinary light, and $\gamma_c$ is the Pockel's constant. If the crystals are precisely machined so that the length $l_1$ of the crystal A is equal to the length $l_2$ of the crystal B, the temperature dependence of the term including the difference between the refractive index $n_o$ of an ordinary ray and the refractive index $n_e$ of an extraordinary ray can be theoretically eliminated.

However, in practice, it is considerably difficult to precisely machine the crystals so that the lengths $l_1$ and $l_2$ are precisely equal, to couple the crystals together, and to mount the crystals thus coupled in a casing without imparting stress to the crystals. Thus, it is extremely difficult to manufacture such a temperature compensation type device.

FIG. 5 shows a temperature characteristic curve of a temperature compensation type voltage measuring device using a $LiNbO_3$ crystal. In FIG. 5, relative values plotted on the vertical axis are output voltage/average received light powers, namely, $$\frac{1}{2} lP_{in}\pi \frac{V_{in}}{V_\pi} / \frac{1}{2} lP_{in} = \pi \frac{V_{in}}{V_\pi},$$

from the equation (2).

In view of the above-described difficulties accompanying a conventional voltage and electric field measuring device, an object of the present invention is to provide a voltage and electric field measuring device in which the electro-optic crystal has a high temperature stability and which can be easily manufactured.

SUMMARY OF THE INVENTION

The foregoing object and other objects of the invention have been achieved by the provision of a voltage and electric field measuring device having a polarizer, an electro-optic crystal, a wave plate and an analyzer arranged in the direction of advancement of light applied thereto in which, according to the invention, the electro-optic crystal is made of bismuth silicon oxide ($Bi_{12}SiO_{20}$, $Bi_4Si_3O_{20}$), or bismuth germanium oxide ($Bi_4Ge_3O_{12}$). Bismuth silicon oxide and bismuth germanium oxide are similar in physical characteristics to each other as will become more apparent later.

BRIEF DESCRIPTION OF THE DRAWINGS

FIG. 8A is a schematic diagram showing a test circuit;

FIG. 8B is a graphical representation indicating an output voltage-input voltage characteristic of the test circuit shown in FIG. 8A.

DESCRIPTION OF THE PREFERRED EMBODIMENTS

A preferred embodiment of a measuring device constructed according to the invention will be described mainly with reference to FIGS. 6 through 9.

Figure 6:
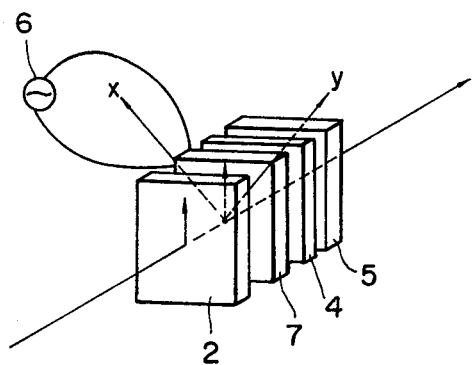
FIG. 6 is an explanatory diagram showing an example of a voltage measuring device utilizing a bismuth silicon oxide ($Bi_{12}SiO_{20}$) crystal in accordance with the invention.

An optical system composed of a polarizer 2, an electro-optic crystal 7, a quarter-wave plate 4 and an analyzer 5 arranged in the direction of advancement of incident light is provided as shown in FIG. 6. In this system, the electro-optic crystal 7 is made of bismuth silicon oxide ($Bi_{12}SiO_{20}$, $Bi_4Si_3O_{12}$) or bismuth germanium oxide ($Bi_{12}GeO_{20}$, $Bi_4Ge_3O_{12}$). The temperature dependence of the electro-optic crystal made of bismuth silicon oxide or bismuth germanium oxide is reduced compared to prior art constructions due to the following reasons:

(1) Bismuth silicon oxide and bismuth germanium oxide belong to a cubic system which has no natural birefringence. Accordingly, the above-described temperature compensation technique is unnecessary when a crystal of the preferred type is used.

Figure 7:
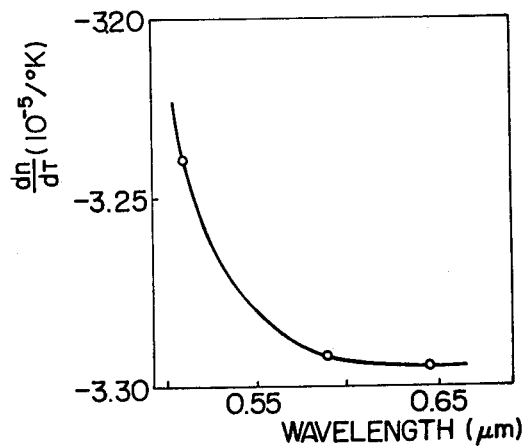
FIG. 7 is a graphical representation showing the variation of the refractive index variation factor with wavelength.

(2) As is clear from the equation (2), the temperature dependence of the term $V_\pi$ must be taken into consideration. In the case of bismuth silicon oxide and bismuth germanium oxide, $V_\pi$ is $\lambda_o/2n^3\gamma_{41}$ for the actually used crystal orientation where $\gamma_{41}$ is Pockel's constant for crystals of the cubic lattice system. Therefore, the temperature dependence of the terms $n^3$ and $\gamma_{41}$ must be considered. No actual measurement data appears to have been published to date for $\gamma_{41}$. However, as for $n^3$, according to available publications, as shown in FIG. 7, the temperature variation factor of the refractive index is:

$$dn/dT \approx 3 \times 10^{-5} \text{ and } \frac{dV}{dT} = \frac{\lambda_o}{2\gamma_{41}} \frac{-3}{n_o^4} \frac{dn}{dT} =$$

$$V_\pi \frac{-3}{n} \frac{dn}{dT} \approx V_\pi \times 10^{-5}$$

Thus, while no actual measurement data is available for the temperature dependence of $\gamma_{41}$, it can be estimated that a variation of the order of 0.01% per degree is present in the term $dV_\pi/dT$.

Voltage measurements were carried out with a circuit arranged as shown in FIG. 8A as a result of which an input voltage $V_{in}$ vs output voltage $V_{out}$ characteristic of excellent linearity was obtained as shown in FIG. 8B.

Figure 1A:
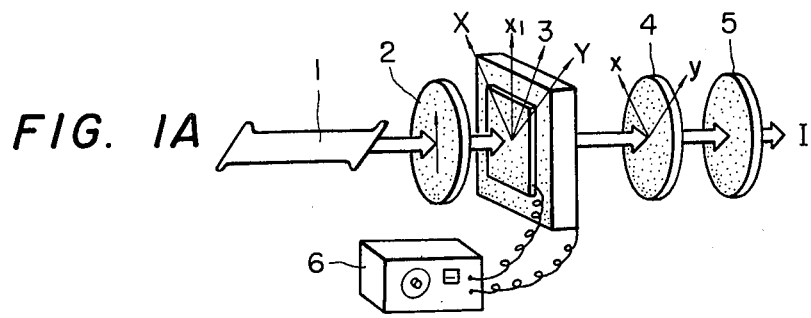
FIG. 1A is an explanatory diagram showing the arrangement of a conventional voltage and electric field measuring device.
Figure 1B:
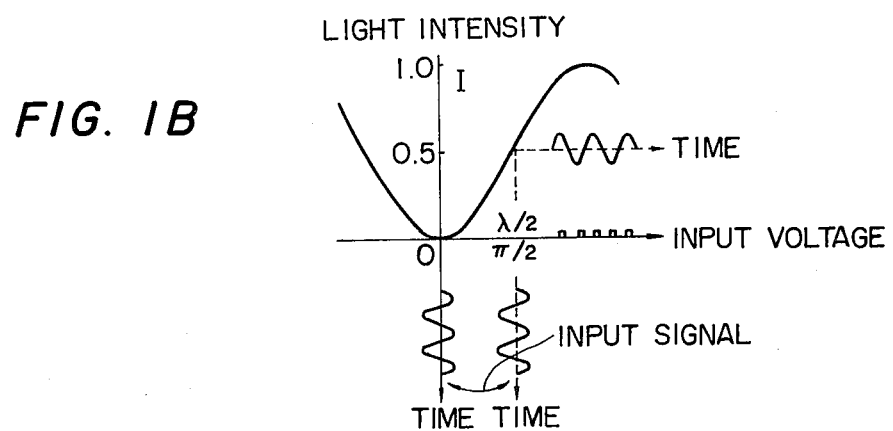
FIG. 1B is a waveform diagram for a description of a quarter-wave plate.
Figure 2:
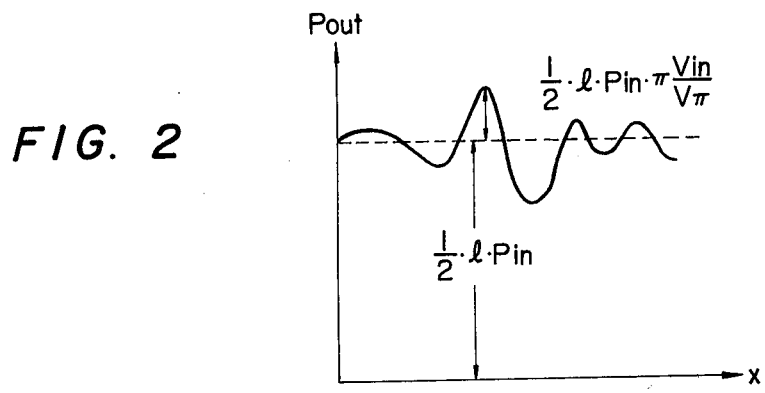
Figure 3A:
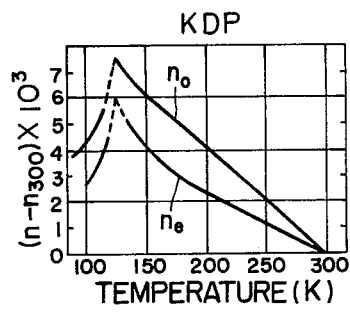
FIGS. 3A–3C are graphical representations indicating three examples of temperature dependence characteristics of ordinary rays and extraordinary rays.
Figure 3B:
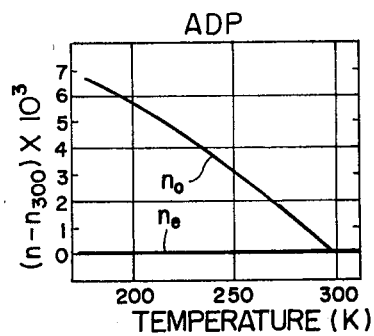
Figure 3C:
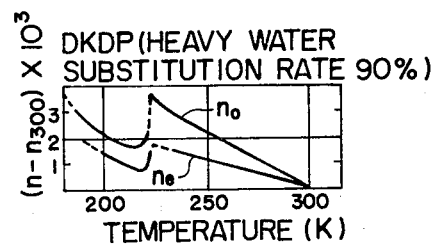
Figure 4:
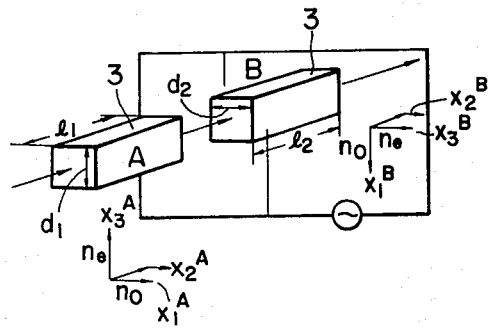
FIG. 4 is an explanatory diagram showing the arrangement of a temperature compensation type electro-optic crystal.
Figure 5:
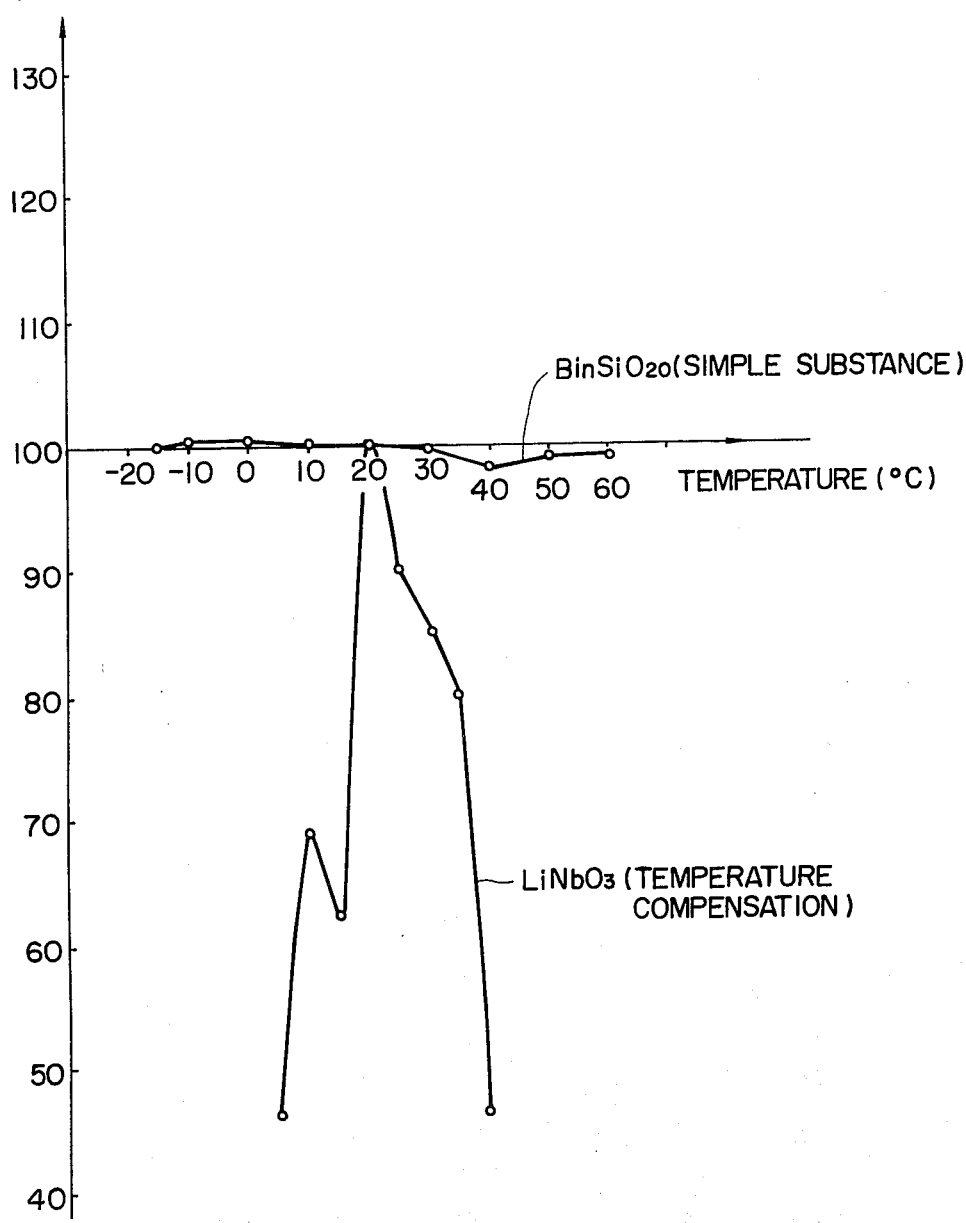
FIGS. 5 and 10 are temperature characteristic diagrams indicating the variation of output voltage/average received light power with temperature.

In addition, it has been confirmed that the temperature characteristic of output voltage/average received light power over a temperature range of $-15°$ C. to $60°$ C. with a bismuth silicon oxide crystal ($Bi_{12}SiO_{20}$) is substantially flat as shown in FIG. 5 and its variation is within several percent.

In accordance with the invention, when light linearly polarized by the polarizer 2 is applied to the bismuth silicon oxide or bismuth germanium oxide crystal, the refractive indices of the x and y axes of the bismuth silicon oxide crystal are changed to $n_x = n - \Delta n$ and $n_y = n + \Delta n$ by the applied voltage and the speed of light through crystal changes accordingly. However, this crystal does not have natural birefringence and therefore the value n on the x and y axes does not changes at all. The light emerging from the crystal is different in phase in the direction of the x and y axes and the output light which has passed through the quarter-wave plate 4 and the analyzer 5 and received at a detector 8 is subjected to an amplitude change in proportion to the applied voltage.

Figure 9:
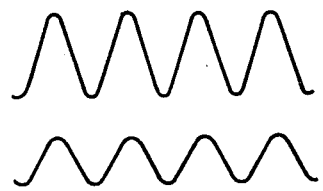
FIGS. 9 and 11 are waveform diagrams showing an input voltage and an output voltage.

The lower and upper parts of FIG. 9 show examples of the waveforms of a 200 Hz sine wave input voltage and of its output voltage.

The system of the invention including a bismuth silicon oxide or bismuth germanium oxide crystal can be applied to optical fiber transmission by utilizing the spatial propagation of light.

Figure 10:
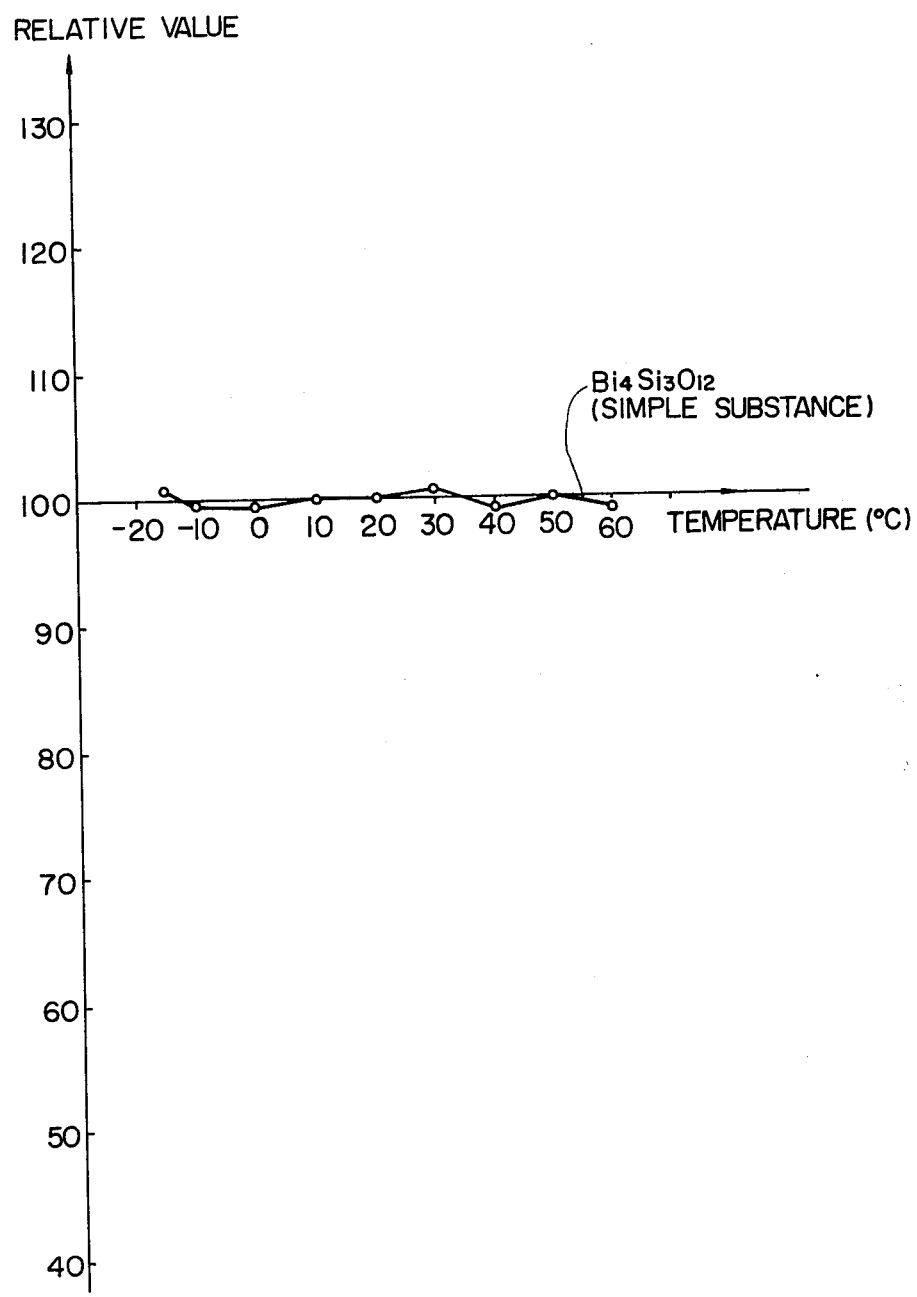
Figure 11:
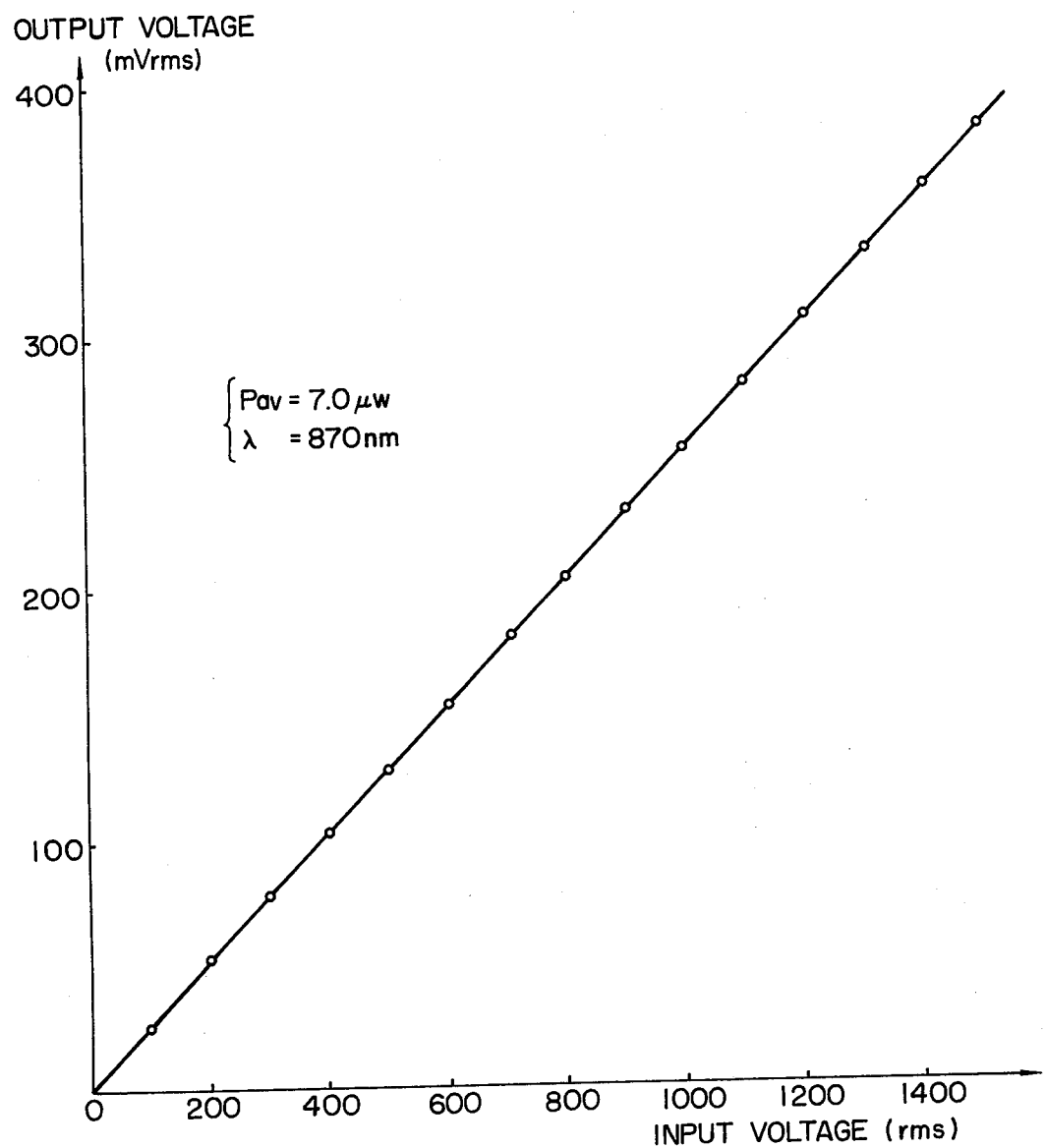

FIG. 10 shows the temperature dependency of bismuth orthosilicate ($Bi_4Si_3O_{12}$) electro-optic crystal which is one of bismuth silicon oxide and FIG. 11 is a waveform diagram showing an input voltage and an output voltage thereof.

As is apparent from the above-described embodiments of the invention, a bismuth silicon oxide or bismuth germanium oxide crystal is employed as the electro-optic crystal. Since these crystal belong to a cubic system, they have no natural birefringence. Accordingly, the conventional electro-optic crystal temperature dependence is eliminated and the provision of a temperature compensation type electro-optic crystal is unnecessary.

Furthermore, the sensor section, which is the system including the electro-optic crystal, can be constructed so that it includes no metal. Therefore, with a measuring device according to the invention, an electric field can be measured safely and without disturbing the electric field itself.

What is claimed is:

1. An electric field measuring device using light, comprising: a source of light; an optical system comprising a polarizer, an electro-optic crystal, a wave plate, and an analyzer arranged in the series with one another in the path of said light, an electric field to be measured being imposed upon said electro-optic crystal, and said electro-optic crystal being made of a bismuth silicon oxide material having a cubic crystal structure; and detector means receiving light outputted by said optical system for producing an electrical signal having a magnitude determined by a magnitude of said electric field.

2. The electric field measuring device of claim 1 wherein said wave plate comprises a quarter-wave plate.

3. The electric field measuring device of claim 1, wherein said material is $Bi_{12}SiO_{20}$.

4. The electric field measuring device of claim 1, wherein said material is bismuth orthosilicate.

5. The electric field measuring device of claim 1, further comprising electrode means coupled to said electro-optic crystal for imposing an electric field to be measured upon said electro-optical crystal in response to a voltage applied to said electrode means.

* * * * *